US006294941B1

(12) United States Patent
Yokosawa

(10) Patent No.: US 6,294,941 B1
(45) Date of Patent: Sep. 25, 2001

(54) SEMICONDUCTOR INTEGRATED CIRCUIT INCLUDING VOLTAGE FOLLOWER CIRCUIT

(75) Inventor: Kouji Yokosawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/339,234

(22) Filed: Jun. 24, 1999

(30) Foreign Application Priority Data

Jun. 26, 1998 (JP) ........................................ 10-181053

(51) Int. Cl.[7] ........................................ H03K 5/08

(52) U.S. Cl. .......................... 327/309; 327/56; 327/323

(58) Field of Search .......................... 327/306, 309, 327/312, 318, 319, 320, 321, 322, 323, 50, 52, 54, 56, 538, 540

(56) References Cited

U.S. PATENT DOCUMENTS 4,161,693 * 7/1979 Carlson ........................ 324/173
5,079,608 * 1/1992 Wodarczyk et al. .............. 357/23.13
5,115,369 * 5/1992 Robb et al. ..................... 361/93
5,396,117 * 3/1995 Housen et al. .................. 327/480
5,422,593 * 6/1995 Fujihira ........................ 327/561
5,532,635 * 7/1996 Watrous et al. ................. 327/310
5,640,084 6/1997 Tero et al. ....................... 323/313
5,689,460 * 11/1997 OOishi ....................... 365/189.07
5,796,278 * 8/1998 Osborn et al. .................. 327/108
5,828,244 * 10/1998 Palara et al. ................ 327/108
6,172,383 * 1/2001 Williams ...................... 257/173

FOREIGN PATENT DOCUMENTS 2 298 531 9/1996 (GB) .
S54-132753 10/1979 (JP) .
S56-8421 8/1982 (JP) .
S62-211820 9/1987 (JP) .
1-124251 5/1989 (JP) .
H6-232646 8/1994 (JP) .
9-321149 12/1997 (JP) .

* cited by examiner

*Primary Examiner*—Timothy P. Callahan
*Assistant Examiner*—Hai L. Nguyen
(74) *Attorney, Agent, or Firm*—Sughrue, Mion, Zinn, Macpeak & Seas, PLLC

(57) ABSTRACT

A voltage follower and a semiconductor integrated circuit including the voltage follower. In the voltage follower, an output voltage Vout from a source follower output transistor 8 is negative fed back to a gate electrode of the source follower output transistor 8 via a differential amplifier 1. A clamp circuit 28 is provided which clamps the gate potential of the source follower transistor 8 by using a source and backgate potential of the source follower transistor 8, that is, potential at an output terminal 53, as a reference potential. Since the source-gate voltage of the source follower transistor 8 is clamped at a predetermined voltage and thus the maximum electric field applied to the gate oxide film is reduced, it becomes possible to use a MOS transistor having thin gate oxide film and short channel length and having high current drive ability, as a source follower transistor, even when a power supply voltage is high.

21 Claims, 3 Drawing Sheets

PRIOR ART

SEMICONDUCTOR INTEGRATED CIRCUIT INCLUDING VOLTAGE FOLLOWER CIRCUIT

FIELD OF THE INVENTION

The present invention relates generally to a voltage follower circuit and a semiconductor integrated circuit including the voltage follower circuit, and more particularly to a voltage follower circuit having a source follower output transistor and a clamp circuit for limiting a gate-source voltage of the source follower output transistor.

BACKGROUND OF THE INVENTION

Conventionally, there is known a voltage follower circuit having a structure in which an output of a source follower output transistor is fed back to the gate electrode of the source follower output transistor via a differential amplifier. An example of such voltage follower circuit is shown in FIG. 5. From FIG. 5, it can be seen that an output n-channel type MOS transistor 26, a resister 9 and a resistor 10 are serially connected between a high potential power supply voltage line 51 and the ground line 52, and thereby a source follower output, stage is constituted. Here, the voltage of the high potential power supply voltage line is designated as Vbatt. The source electrode and the backgate electrode of the transistor 26 are mutually coupled, and a source potential voltage is applied to the backgate electrode. The circuit further comprises a differential amplifier 1 which receives a reference voltage Vref supplied from an external source at a non-inverting input thereof. A potential voltage at the connection point between the resistor 9 and the resistor 10 of the source follower output stage is returned to an inverting input of the differential amplifier 1, and the output point of the differential amplifier 1, that is, node A, is coupled to the gate electrode of the source follower output transistor 26. That is, this circuit constitutes a voltage follower structure by using a negative feedback of a divided voltage of an output voltage Vout as a gate input of the output transistor, via the differential amplifier.

The voltage follower circuit shown in FIG. 5 has a disadvantage in that, when the power supply voltage Vbatt is a high voltage, the area occupied by the circuit becomes large. The reasons for this disadvantage will be described below.

When a LSI including the voltage follower circuit shown in FIG. 5 is used, for example, as an IC for mobile use, the power supply voltage Vbatt is higher than a voltage used for a usual LSI, for example, 5V or 3.3V, and becomes a voltage of approximately between 7 through 40V. What voltage is used as the power supply voltage Vbatt is determined depending on the type of a car, for example, depending on whether a car using the LSI is a passenger car or a truck, and so on. Therefore, the power supply voltage of the LSI for mobile use is selected to be the highest voltage, i.e., 40V in the above-mentioned voltage range between 7V and 40V. This is because, in order to cope with various types of cars by using one type of LSI, it is necessary to guarantee that the LSI can safely function even in the highest power supply voltage.

In FIG. 5, an output voltage range of the amplifier 1 is approximately from the power supply voltage Vbatt (=40V, in case of this example) to the ground potential level. Therefore, depending on the value of the output voltage Vout, for example, when the output terminal 53 is instantaneously short-circuited with the ground, when the output voltage Vout is not yet settled just after the power supply voltage is turned on, and so on, there is a possibility that a voltage which is maximally equal to the power supply voltage Vbatt is applied between the gate electrode and source and backgate electrodes of the source follower transistor 8. To this end, in the circuit of FIG. 5, all the MOS transistors used in the LSI must be high withstanding voltage transistors. Thus, a gate oxide film of each MOS transistor must be thick and also, at the same time, channel length must be long. Consequently, current drive ability of the MOS transistor, shown in the expression below, is deteriorated. In order to guarantee a large current drive ability of the transistor, channel width of the transistor must be made large, and when the LSI is required to have high withstanding voltage and especially large output current, the area occupied by the voltage follower circuit becomes very large.

$$Id=(1/2)*(W/L)\mu_0(\in_{ox}/t_{ox})*(Vgs-Vt)^2$$

(Where, Id: drain current, W: channel width, L: channel length, $\mu_0$: mobility of carrier, $\in_{ox}$: dielectric constant of oxide film, $t_{ox}$: thickness of gate oxide film, Vgs: gate voltage, Vt: threshold voltage of MOS transistor).

SUMMARY OF THE INVENTION

Therefore, it is an object of the present invention to obviate the disadvantages of the conventional voltage follower circuit and of the semiconductor integrated circuit having the voltage follower circuit.

It is another object of the present invention to make it possible to use, as a source follower transistor, a MOS transistor which has thin gate oxide film, which has short channel length and which has high current drive ability, even when a power supply voltage is high, thereby reducing the size of the source follower transistor and thus an area occupied by the transistor, and lowering a cost of a semiconductor integrated circuit including the source follower transistor.

It is still another object of the present invention to provide a voltage follower circuit and a semiconductor integrated circuit having a voltage follower circuit, wherein the voltage follower circuit comprises a source follower transistor and a clamp circuit for limiting a gate-source voltage of the source follower transistor, and to make it possible to use, as the source follower transistor, a MOS transistor which has thin gate oxide film, which has short channel length and which has high current drive ability, even when a power supply voltage is high.

According to one aspect of the present invention, there is provided a semiconductor integrated circuit comprising: a source follower output transistor; and a clamp circuit for clamping a gate potential of the source follower output transistor by using a potential of a source electrode of the source follower output transistor as a reference potential.

In this case, it is preferable that the clamp circuit has finite high impedance ranges on the plus side and on the minus, side with respect to the reference potential.

According to another aspect of the present invention, there is provided a semiconductor integrated circuit having a voltage follower circuit, the voltage follower circuit comprising: a source follower output transistor whose source electrode and backgate electrode are mutually connected; a differential amplifier, via which an output of said source follower circuit is fed back to a gate electrode of the source follower output transistor; and a clamp circuit for clamping a gate potential of the source follower output transistor by using a potential of the source electrode and the backgate electrode of the source follower output transistor as a reference potential.

According to still another aspect of the present invention, there is provided a semiconductor integrated circuit having a voltage follower circuit, the voltage follower circuit comprising: a source follower output stage having an output n-channel type MOS transistor whose drain electrode is connected to a high potential power supply line and whose backgate electrode is connected to the source electrode thereof, and a divider circuit connected between the source electrode of the output n-channel type MOS transistor and the ground line and comprising a series connection of at least a first resistor and a second resistor; a differential amplifier which amplifies a difference voltage between a divided voltage from said divider circuit of said output stage and a reference voltage applied from an external source; wherein the divided voltage from the divider circuit of the output stage being fed back to the gate electrode of the output n-channel type MOS transistor via the differential amplifier; and a clamp circuit for clamping a gate potential of the output n-channel type MOS transistor by using a potential of a source and a backgate of the output n-channel type MOS transistor as a reference potential.

In this case, the clamp circuit may comprise a first n-channel type MOS transistor and second at least one n-channel type MOS transistors serially connected between the high potential power supply voltage line and the gate electrode of the output n-channel type MOS transistor, drain electrode of the first n-channel type MOS transistor being connected to tile high potential power supply voltage line and, in each of the second at least one n-channel type MOS transistors, drain electrode and gate electrode being mutually connected, wherein the clamp circuit further comprises a first p-channel type MOS transistor and second at least one p-channel type MOS transistors serially connected between the ground line and the gate electrode of the output n-channel type MOS transistor, drain electrode of the first p-channel type MOS transistor being connected to the ground line and, in each of the second at least one p-channel type MOS transistors, drain electrode and gate electrode being mutually connected, and wherein the gate electrode of the first n-channel type MOS transistor, the gate electrode of the first p-channel type MOS transistor, and the source and backgate electrodes of the output n-channel type MOS transistor are mutually connected.

It is also preferable that the clamp circuit may comprise a first n-channel type MOS transistor and a first at least one serially connected pn-junction diodes serially connected between the high potential power supply voltage line and the gate electrode of the output n-channel type MOS transistor, drain electrode of the first n-channel type MOS transistor being connected to the high potential power supply voltage line and anode electrode of one of the pn-junction diodes being connected to the source electrode of the first n-channel type MOS transistor, wherein the clamp circuit further comprises a first p-channel type MOS transistor and second at least one serially connected pn-junction diodes serially connected between the ground line and the gate electrode of the output n-channel type MOS transistor, drain electrode of the first p-channel type MOS transistor being connected to the ground line and cathode electrode of one of the pn-junction diodes being connected to the source electrode of the first p-channel type MOS transistor, and wherein the gate electrode of the first n-channel type MOS transistor, the gate electrode of the first p-channel type MOS transistor, and the source and backgate electrodes of the output n-channel type MOS transistor are mutually connected.

In place of the above-mentioned clamp circuit, the clamp circuit may comprise a first serial connection of at least one pn-junction diodes in which anode electrode of said pn-junction diode at one end of the first serial connection is connected to the gate electrode of the output n-channel type MOS transistor and cathode electrode of the pn-junction diode at other end the first serial connection is connected to the source and backgate electrodes of the output n-channel type MOS transistor, and wherein the clamp circuit further comprises a second serial connection of at least one pn-junction diodes in which cathode electrode of the pn-junction diode at one end of the second serial connection is connected to the gate electrode of the output n-channel type MOS transistor and anode electrode of the pn-junction diodes at other end of the second serial connection is connected to the source and backgate electrodes of the output n-channel type MOS transistor.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
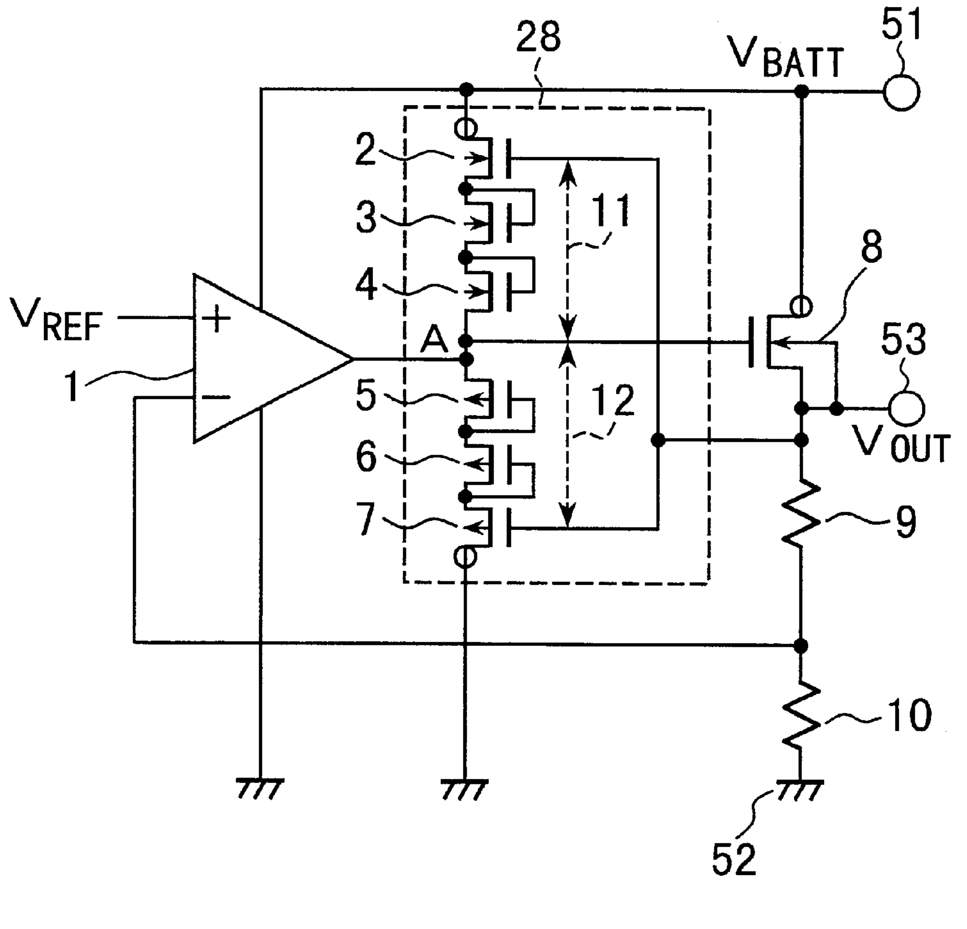
FIG. 1 is a circuit diagram showing a voltage follower according to a first embodiment of the present invention.

With reference to the drawings, embodiments of the present invention will now be described. FIG. 1 shows a circuit diagram of a voltage follower circuit in a semiconductor integrated circuit according to a first embodiment of the present invention. As can be seen from FIG. 1, this circuit is a stabilized power supply circuit constituted by a voltage follower circuit which receives a power supply voltage Vbatt as a power supply input and uses a voltage Vref supplied from an external source as a reference voltage.

An output stage of this circuit is a source follower output circuit composed of a source follower transistor or nMOS transistor 8 and a resistor portion. The resistor portion comprises two serially connected resistors 9 and 10. Drain electrode of the nMOS transistor 8 is connected to a high potential power supply voltage line 51. Source electrode and backgate electrode of the the nMOS transistor 8 are mutually connected, that is, potential of the source electrode is applied to the backgate electrode. The source electrode of the nMOS transistor 8 is connected to an output terminal 53 of the voltage follower circuit of FIG. 1. The source electrode of the nMOS transistor 8 is also connected to one terminal of the resistor 9, and other terminal of the resistor 9 is connected to one terminal of the resistor 10. Other terminal of the resistor 10 is connected to the ground line.

Figure 5:
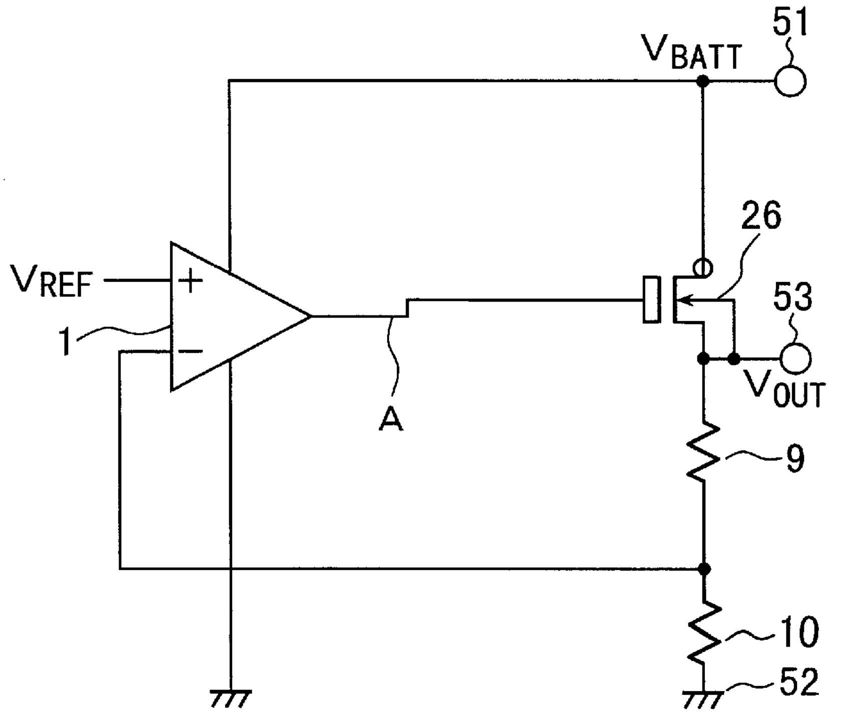
FIG. 5 is a circuit diagram showing an example of a conventional voltage follower.

It is preferable that the nMOS transistor 8 is a MOS transistor whose gate oxide film is made thicker on the drain side than on the source side, thereby withstanding voltage on the drain side is made higher. Since the gate oxide film on the source side is not thick, the nMOS transistor 8 can have large mobility and thus the current drive ability thereof can be large. The size of such MOS transistor can be smaller than that of the nMOS transistor 26 of FIG. 5 which has wholly thick gate oxide film and which has low mobility.

The circuit of FIG. 1 also comprises a differential amplifier 1 whose non-inverting input receives a reference voltage Vref supplied from an external source. An output terminal of the differential amplifier 1, that is, a node A, is connected to the gate electrode of the nMOS transistor 8. The serial connection point of the resistors 9 and 10 is connected to an inverting input of the differential amplifier 1, so that a potential voltage of the serial connection point of the resistors 9 and 10 is returned to the inverting input point of the differential amplifier 1.

The voltage follower circuit of FIG. 1 further comprises a clamp circuit 28 which is connected to the gate electrode of the source follower transistor 8, the high potential power supply voltage line 51 and the ground line 52. The clamp circuit 28 limits a voltage between the gate electrode and the source and backgate electrodes of the source follower transistor 8, that is, a source-gate voltage.

The above-mentioned clamp circuit 28 comprises three nMOS transistors 2, 3 and 4 which are vertically connected between the high potential power supply voltage line (Vbatt) 51 and the node A (a connection point between an output node of the differential amplifier 1 and the gate electrode of the source follower transistor 8), and three pMOS transistors 5, 6 and 7 which are vertically connected between the node A and the ground line 52.

Also, it is preferable that each of the DMOS transistor 2 and the pMOS transistor 7 is a MOS transistor whose gate oxide film is made thicker on the drain side than on the source side, thereby withstanding voltage on the drain side is made higher. Since the gate oxide film on the source side is not thick, the transistors 2 and 7 have large mobility and thus the current drive ability thereof can be large.

Drain electrode of the nMOS transistor 2 is connected to the high potential power supply voltage line 51, and source electrode of the nMOS transistor 2 is connected to drain electrode of the nMOS transistor 3. Drain electrode and gate electrode of the nMOS transistor 3 are mutually connected. Source electrode of the nMOS transistor 3 is connected to drain electrode of the mMOS transistor 4. Drain electrode and gate electrode of the nMOS transistor 4 are mutually connected. Source electrode of the nMOS transistor 4 is connected to the node A.

Drain electrode of the pMOS transistor 7 is connected to the ground line 52, and source electrode of the pMOS transistor 7 is connected to drain electrode of the pMOS transistor 6. Drain electrode and gate electrode of the pMOS transistor 6 are mutually connected. Source electrode of the pMOS transistor 6 is connected to drain electrode of the pMOS transistor 5. Drain electrode and gate electrode of the pMOS transistor 5 are mutually connected. Source electrode of the pMOS transistor 5 is connected to the node A.

The gate electrode of the nMOS transistor 2 whose drain electrode is directly connected to the power supply line 51, the gate electrode of the pMOS transistor 7 whose drain electrode is directly connected to the ground line 52, and the source and backgate electrodes of the source follower transistor 8 are commonly connected. Thus, the node A, the output node of the amplifier 1, and the gate electrode of the source follower transistor 8 are commonly connected. The source follower output transistor 8, the nMOS transistor 2 in the clamp circuit which is nearest to the high potential power supply line and the pMOS transistor 7 in the clamp circuit which is nearest to the ground line are respectively constituted by MOS transistors each of which has a so called LDD (Lightly Doped Drain) structure having low impurity concentration at a drain region to realize high withstanding voltage.

Operation of the voltage follower circuit according to this embodiment will be explained below with reference to FIG. 1 and FIG. 2. With reference to FIG. 1, the circuit shown in this drawing constitutes a voltage follower and, during normal operation, outputs a stabilized output voltage Vout as shown by the following expression (1) at the output terminal 53.

$$Vout=Vref*(R9+R10)/R10 \quad (1)$$

(Where, Vref: value of the reference voltage, R9 and R10: resistance values of the resistors 9 and 10, respectively).

The output voltage at the output terminal 53 is expected to vary due to, for example, short circuit with the ground line 52, and, therefore, is controlled by a negative feedback to the gate potential (potential of the node A) of the source follower transistor 8 of the output stage, such that the output voltage becomes stable. Also, the above-mentioned clamp circuit 28 is provided to limit the gate-source voltage of the source follower transistor 8 so as to prevent it from exceeding a predetermined voltage level. If the clamp circuit 28 is not used, the output voltage range of the amplifier 1 becomes approximately from the power supply voltage Vbatt to the ground potential, and, depending on the value of the output voltage Vout, a voltage whose maximum value corresponds to the power supply voltage Vbatt is applied between the gate electrode and the source and backgate electrodes of the source follower transistor 8. The clamp circuit 28 avoids such disadvantage.

In the clamp circuit 28 of FIG. 1, drain electrode of the nMOS transistor 2 is connected to the high potential power supply voltage line 51, and drain electrode of the pMOS transistor 7 is connected to the ground line 52. Also, the gate electrode of the nMOS transistor 2, the gate electrode of the pMOS transistor 7 and the source and backgate electrodes of the source follower nMOS transistor 8 are commonly connected. Between the source electrode of the nMOS transistor 2 and the node A, two nMOS transistors 3 and 4 are vertically connected, and, in each of the two nMOS transistors 3 and 4, the drain electrode and the gate electrode are mutually connected. Also, between the source electrode of the pMOS transistor 7 and the node A, two pMOS transistors 5 and 6 are vertically connected, and, in each of the two pMOS transistors 5 and 6, the drain electrode and the gate electrode are mutually connected. The output point of the amplifier 1, i.e., node A, is connected to the gate electrode of the source follower transistor 8.

Therefore, the nMOS transistors 2, 3, 4 and the pMOS transistors 7, 6, 5 both within the clamp circuit 28 do not become conductive at the same time. Only transistors of either one channel type become conductive at the same time, or transistors of both channel types are in non-conducting status, depending on the potential of each node. Here, potential of the node A is designated as Va, a threshold voltage of each nMOS transistor is designated as Vtn, and a threshold voltage of each pMOS transistor is designated as Vtp. In this case, the following expressions (2), (3) and (4) show a condition that the nMOS transistors 2, 3 and 4 are in conductive state, a condition that the pMOS transistors 7, 6 and 5 are in conductive state, and a condition that the transistors 2, 3, 4, 7, 6 and 5 of both channel types are all in non-conductive state, that is, in high impedance state, respectively resulting in finite high impendance ranges on the plus side and on the minus side with respect to the reference potential.

$$Va<Vout-3*Vtn \quad (2)$$

$$Va>Vout+3*|Vtp| \quad (3)$$

$$Vout-3*Vtn<Va<Vout+3*|Vtp| \quad (4\text{-}1)$$

From the expression (4-1), the following expression (4-2) derived.

$$-3*Vtn<Va-Vout<3*|Vtp| \quad (4\text{-}2)$$

In a voltage range shown by the expression (4-2), usual feedback function is performed and circuit is controlled as a voltage follower. However, in a voltage range other than that shown by the expression (4-2), limitation shown by the expressions (2) and (3) is applied to the potential Va at the node A, and clamping is performed.

Figure 2:
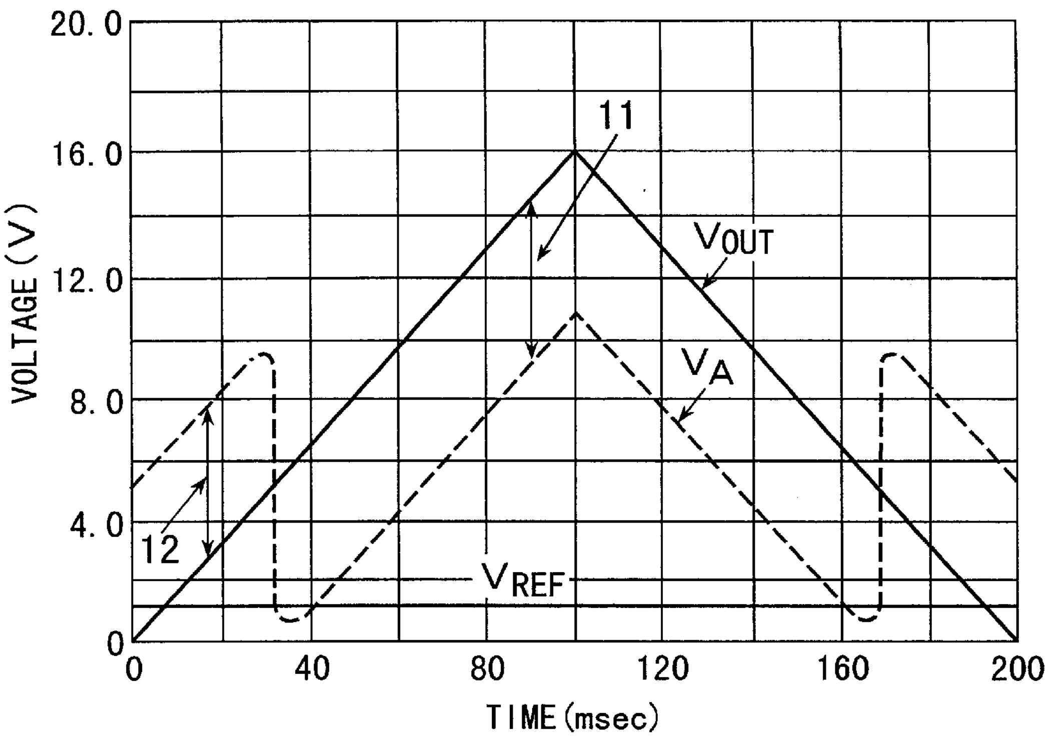
FIG. 2 is a view showing a result of simulation of a gate voltage of a source follower transistor, when a voltage is forcibly applied to an output terminal from outside, in the voltage follower shown in FIG. 1.

FIG. 2 is a view showing waveforms obtained by simulating a potential Va at the node A, when a voltage is forcibly applied to the output terminal 53 from outside. In FIG. 2, abscissa, that is, horizontal axis designates time and ordinate, that is, vertical axis designates voltage. That is, FIG. 2 shows change of the potential Va at the node A, when a voltage Vout, which is a voltage applied to the output terminal 53 from outside, is raised from 0 volt to 16 volts at a constant rate and then is reduced from 16 volts to 0 volt at the same rate. Potential difference 11 in FIG. 2 is a potential voltage of a portion designated by a reference numeral 11 in FIG. 1, and is clamped by the voltage shown by the expression (2) above. Also, potential difference 12 in FIG. 2 is a potential voltage of a portion designated by a reference numeral 12 in FIG. 1, and is clamped by the voltage shown by the expression (3) above.

In general, drain current Id of a MOS transistor is, as mentioned above, shown by the following expression.

$$Id=(1/2)*(W/L)\mu_0(\in_{ox}/t_{ox})*(Vgs-Vt)^2$$

That is, the thinner the thickness of the gate oxide film, the higher the current drive ability of the transistor. In this case, the channel length can also be made shorter, and therefore the area occupied by the transistor can be synergistically smaller. According to the present invention, a voltage clamp circuit is provided between the gate electrode and the source and the backgate electrodes of the source follower transistor 8. Therefore, even when the power supply voltage Vbatt is high, it is possible to prevent the gate-source voltage of the source follower transistor from exceeding the voltage corresponding to the breakdown electric field of an oxide film immediately below a gate electrode (approximately $7V/100\times10^{-8}$ cm). Thus, it becomes possible to use a MOS transistor having high current drive ability, which has thin gate oxide film and short channel length, as the source follower transistor, and therefore, it is possible to reduce the area occupied by the voltage follower.

Figure 3:
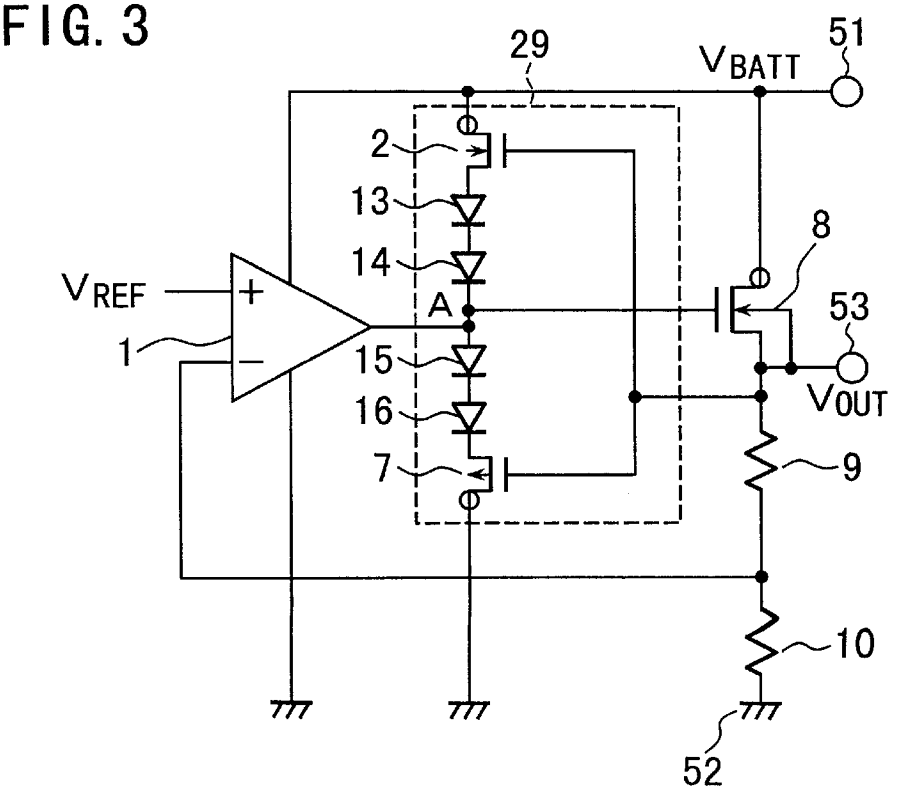
FIG. 3 is a circuit diagram showing a voltage follower according to a second embodiment of the present invention.
Figure 4:
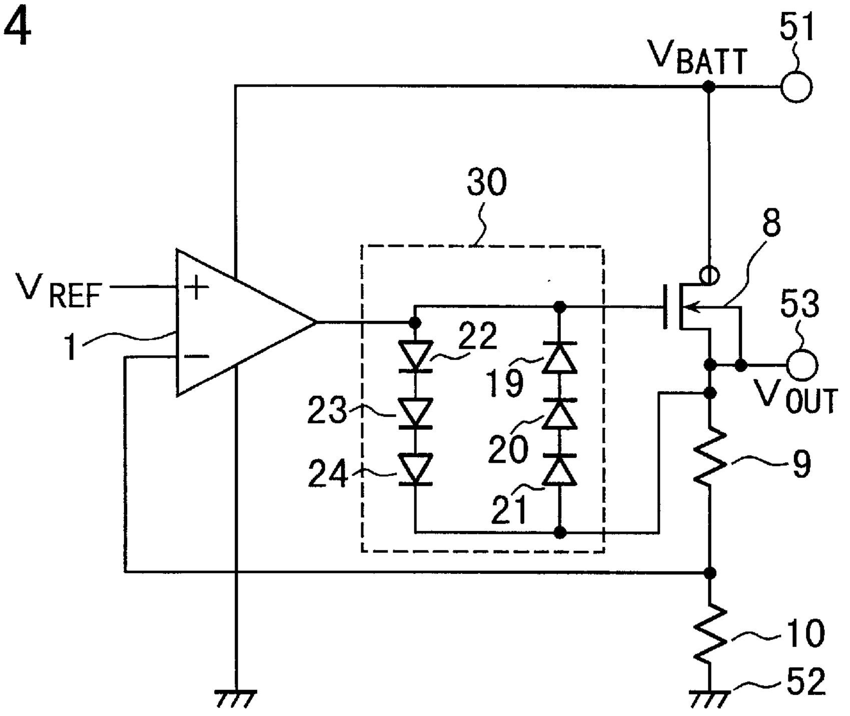
FIG. 4 is a circuit diagram showing a voltage follower according to a third embodiment of the present invention.

FIG. 3 and FIG. 4 show circuit diagrams of voltage followers according to a second embodiment and a third embodiment of the present invention, respectively. In these two embodiments, pn junction diodes are used in the clamp circuits.

With reference to FIG. 3, a clamp circuit 29 in the second embodiment shown in this drawing has a structure in which two nMOS transistors 3 and 4 and two pMOS transistors 5 and 6 of the clamp circuit 28 of the first embodiment (see FIG. 1) are replaced by two pn junction diodes 13 and 14 and two pn junction diodes 15 and 16, respectively. Cathode of the diode 13 is connected to the source electrode of the nMOS transistor 2, and anode of the diode 13 is connected to cathode of diode 14. Anode of the diode 14 is connected to the node A. Also, cathode of the diode 16 is connected to the source electrode of the pMOS transistor 7, and anode of the diode 16 is connected to cathode of diode 15. Anode of the diode 15 is connected to the node A. The other structure of the circuit shown in FIG. 3 is the same as that of the circuit of FIG. 1.

When a forward voltage of each diode is designated as Vf, the condition in which the nMOS transistor 2 and the diodes 13 and 14 become conductive is, as in the first embodiment, shown by the expression (5) below.

$$Va<Vout-(Vtn+2*Vf) \quad (5)$$

Also, the condition in which the pMOS transistor 7 and the diodes 15 and 16 become conductive is shown by the expression (6) below.

$$Va>Vout+|Vtp|+2*Vf \quad (6)$$

Therefore, from the expressions (5) and (6), the condition in which the nMOS transistor 2, pMOS transistor 7 and the diodes 13 through 16 are all in non-conductive state, that is, in high impedance state, resulting in finite high impedance ranges on the plus side and on the minus side with respect to the reference potential, is shown by the expression (7-1) below or the expression (7-2) below which is derived from the expression (7-1).

$$Vout-(Vtn+2*Vf)<Va<Vout+|Vtp|+2*Vf \quad (7\text{-}1)$$

$$Vtn-*2*Vf<Va-Vout<|Vtp|+2*Vf \quad (7\text{-}2)$$

FIG. 4 shows a circuit diagram of a voltage follower circuit according to the third embodiment. The circuit of FIG. 4 only differs from the circuit of FIG. 1 or FIG. 3 in the structure of a clamp circuit. That is, the clamp circuit designated by a reference numeral 30 comprises two sets of aeries connection of pn junction diodes. One set of the diodes comprises three diodes 19, 20 and 21 connected in series between gate electrode of the source follower transistor 8, that is, node A, and source electrode of the source follower transistor 8. Cathode of the diode 19 is connected to the gate electrode of the source follower transistor 8, and anode of the diode 19 is connected to cathode of the diode 20. Anode of the diode 20 is connected to cathode of the diode 21. Anode of the diode 21 is connected to the source electrode of the source follower transistor 8.

The other set of diodes comprises three diodes 22, 23 and 24 connected in series between gate electrode of the source follower transistor 8, that is, node A, and source electrode of the source follower transistor 8. Anode of the diode 22 is connected to the gate electrode of the source follower transistor 8, and cathode of the diode 22 is connected to anode of the diodes 23. Cathode of the diode 23 is connected to anode of the diode 24. Cathode of the diode 24 is connected to the source electrode of the source follower transistor 8.

In the voltage follower according to the third embodiment shown in FIG. 4, the condition in which diodes 19, 20 and 21 in a clamp circuit 30 become conductive is shown by the expression (8) below.

$$Va<Vout-3*Vf \quad (8)$$

On the other hand, the condition in which diode 22, 23 and 24 become conductive is shown by the expression (9) below.

$$Va>Vout+3*Vf \quad (9)$$

Therefore, from the expressions (8) and (9), the condition in which the diodes 19 through 24 are all in non-conductive state, that is, in high impedance state, resulting in finite high impedance ranges on the plus side and on the minus side with respect to the reference potential, is shown by the expression (10-1) below or the expression (10-2) below which is derived from the expression (10-1).

$$Vout-3*Vf<Va<Vout+3*Vf \quad (10\text{-}1)$$

$$-3*Vf<Va-Vout<3*Vf \quad (10\text{-}2)$$

As apparent from the above description concerning the first through third embodiments, in the present invention, the gate voltage of the source follower transistor is limited within a control range represented by the expression (4-1), the expression (7-2) or the expression (10-2), by the clamp circuit which performs such limitation by using the source potential of the source follower transistor as a reference potential. Therefore, it is possible to use a MOS transistor having high current drive ability which has thin gate oxide film and short channel length, as a source follower transistor. Required clamp voltage level can be adjusted to any value by selecting the number of the nMOS transistors, pMOS transistors or pn junction diodes connected to constitute the clamp circuit.

As mentioned above, a semiconductor integrated circuit according to the present invention comprises a clamp circuit which clamps gate potential of a source follower output transistor by using source and backgate potential of the source follower output transistor as a reference potential.

Thereby, according to the present invention, it is possible to use a MOS transistor having high current drive ability whose gate oxide film is thin and whose channel length is short, as a source follower transistor, and also to decrease the area occupied by a voltage follower. Required clamp voltage level can be adjusted to any value by selecting the number of connection stages of nMOS transistors, pMOS transistors or pn junction diodes constituting a clamp circuit. The present invention is useful when coping with uses in which high and various voltages are used as power supply voltages, by using one kind of LSI, for example, when coping with uses in a mobile LSI and so on. The present invention is especially useful in uses requiring high current output.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A semiconductor integrated circuit comprising:

a source follower output transistor; and a clamp circuit for clamping a gate potential of said source follower output transistor, said clamp circuit comprising:

at least one n-channel type MOS transistor connected in series between a first power supply voltage line and a gate electrode of said source follower output transistor; and at least one p-channel type MOS transistor connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

2. A semiconductor integrated circuit as set forth in claim 1, wherein said clamp circuit has predetermined finite high impedance ranges on the plus side and on the minus side with respect to a potential of said source electrode of said source follower output transistor;

wherein said high impedance ranges are determined by the number of n-channel type MOS transistors and p-channel type MOS transistors connected in said clamp circuit.

3. A semiconductor integrated circuit having a voltage follower circuit, said voltage follower circuit comprising:

a source follower output transistor whose source electrode and backgate electrode are mutually connected;

a differential amplifier, one input of which is connected to an output of said source follower output transistor, an output of the differential amplifier being connected to a gate electrode of said source follower output transistor; and a clamp circuit for clamping a gate potential of said source follower output transistor, said clamp circuit comprising:

at least one n-channel type MOS transistor connected in series between a first power supply voltage line and a gate electrode of said source follower output transistor; and at least one p-channel type MOS transistor connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

4. A semiconductor integrated circuit as set forth in claim 3, wherein said clamp circuit has predetermined finite high impedance ranges on the plus side and on the minus side with respect to a potential of said source electrode of said source follower output transistor;

wherein said high impedance ranges are determined by the number of n-channel type MOS transistors and p-channel type MOS transistors connected in said clamp circuit.

5. A semiconductor integrated circuit having a voltage follower circuit, said voltage follower circuit comprising:

a source follower output stage having an output n-channel type MOS transistor whose drain electrode is connected to a first power supply voltage line and whose backgate electrode is connected to the source electrode thereof, and a divider circuit connected between the source electrode of aid output n-channel type MOS transistor and a second power supply voltage line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

at least one n-channel type MOS transistor connected in series between a first power supply voltage line and a gate electrode of said source follower output transistor; and at least one p-channel type MOS transistor connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

6. A semiconductor integrated circuit as set forth in claim 5, wherein said clamp circuit has predetermined finite high impedance ranges on the plus side and on the minus side with respect to a potential of said source electrode of said source follower output transistor;

wherein said high impedance ranges are determined by the number of n-channel type MOS transistors and p-channel type MOS transistors connected in said clamp circuit.

7. A semiconductor integrated circuit having a voltage follower circuit, said voltage follower circuit comprising:

a source follower output stage having an output n-channel type MOS transistor whose drain electrode is connected to a high potential power supply line and whose backgate electrode is connected to the source electrode thereof, and a divider circuit connected between the source electrode of said output n-channel type MOS transistor and a ground line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

a first n-channel type MOS transistor and second at least one n-channel type MOS transistor serially connected between said high potential power supply voltage line and the gate electrode of said output n-channel type MOS transistor, drain electrode of said first n-channel type MOS transistor being connected to said high potential power supply voltage line and, in each of said second at least one n-channel type MOS transistors, drain electrode and gate electrode being mutually connected; and a first p-channel type MOS transistor and second at least one p-channel type MOS transistor serially connected between said ground line and the gate electrode of said output n-channel type MOS transistor, drain electrode of said first p-channel type MOS transistor being connected to said ground line and, in each of said second at least one p-channel type MOS transistors, drain electrode and gate electrode being mutually connected;

wherein the gate electrode of said first n-channel type MOS transistor, the gate electrode of said first p-channel type MOS transistor, and the source and backgate electrodes of said output n-channel type MOS transistor are mutually connected.

8. A semiconductor integrated circuit having a voltage follower circuit, said voltage follower circuit comprising:

a source follower output stage having an output n-channel type MOS transistor whose drain electrode is connected to a high potential power supply line and whose backgate electrode is connected to the source electrode thereof, and a divider circuit connected between the source electrode of said output n-channel type MOS transistor and a ground line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

a first n-channel type MOS transistor and a first at least one pn-junction diode serially connected between said high potential power supply voltage line and the gate electrode of said output n-channel type MOS transistor, drain electrode of said first n-channel type MOS transistor being connected to said high potential power supply voltage line and anode electrode of one of said pn-junction diodes being connected to the source electrode of said first n-channel type MOS transistor; and a first p-channel type MOS transistor and second at least one pn-junction diode serially connected between said ground line and the gate electrode of said output n-channel type MOS transistor, drain electrode of said first p-channel type MOS transistor being connected to said ground line and cathode electrode of one of said pn-junction diodes being connected to the source electrode of said first p-channel type MOS transistor;

wherein the gate electrode of said first n-channel type MOS transistor, the gate electrode of said first p-channel type MOS transistor, and the source and backgate electrodes of said output n-channel type MOS transistor are mutually connected.

9. A semiconductor integrated circuit having a voltage follower circuit, said voltage follower circuit comprising:

a source follower output stage having an output n-channel type MOS transistor whose drain electrode is connected to a high potential power supply line and whose backgate electrode is connected to the source electrode thereof, and a divider circuit connected between the source electrode of said output n-channel type MOS transistor and a ground line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

a first serial connection of at least one pn-junction diode having an anode electrode connected to the gate electrode of said output n-channel type MOS transistor and a cathode electrode connected to the source and backgate electrodes of said output n-channel type MOS transistor; and a second serial connection of at least one pn-junction diode having a cathode electrode connected to the gate electrode of said output n-channel type MOS transistor and an anode electrode connected to the source and backgate electrodes of said output n-channel type MOS transistor.

10. A semiconductor integrated circuit comprising:

a source follower output transistor; and a clamp circuit for clamping a gate potential of said source follower output transistor, said clamp circuit comprising:

at least one n-channel type MOS transistor and at least one pn-junction diode connected in series between a first power supply voltage line and a gate electrode of said source follower output transistor; and at least one p-channel type MOS transistor and at least one pn-junction diode connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

11. A semiconductor integrated circuit as set forth in claim 10, wherein said clamp circuit has predetermined finite high impedance ranges on the plus side and on the minus side with respect to a potential of said source electrode of said source follower output transistor;

wherein said high impedance ranges are determined by the number of n-channel type MOS transistors, p-channel type MOS transistors, and pn-junction diodes connected in said clamp circuit.

12. A semiconductor integrated circuit comprising:

a source follower output transistor; and a clamp circuit for clamping a gate potential of said source follower output transistor, said clamp circuit comprising:

a first serial connection of at least one pn-junction diode having an anode electrode connected to the gate electrode of said source follower output transistor and a cathode electrode connected to the source and backgate electrodes of said source follower output transistor; and a second serial connection of at least one pn-junction diode having a cathode electrode connected to the gate electrode of said source follower output transistor and an anode electrode connected to the source and backgate electrodes of said source follower output transistor.

13. A semiconductor integrated circuit as set forth in claim 12, wherein said clamp circuit has predetermined finite high impedance ranges on the plus side and on the minus side with respect to a potential of said source electrode of said source follower output transistor;

wherein said high impedance ranges are determined by the number of pn-junction diodes connected in said clamp circuit.

14. A semiconductor integrated circuit having a voltage follower circuit, said voltage follower circuit comprising:

a source follower output transistor;

a differential amplifier, one input of which is connected to an output of said source follower output transistor, an output of the differential amplifier being connected to a gate electrode of said source follower output transistor; and a clamp circuit for clamping a gate potential of said source follower output transistor, said clamp circuit comprising:

at least one n-channel type MOS transistor and at least one pn-junction diode connected in series between a first power supply voltage line and a gate electrode of said source follower output transistor; and at least one p-channel type MOS transistor and at least one pn-junction diode connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

15. A semiconductor integrated circuit as set forth in claim 14, wherein said clamp circuit has predetermined finite high impedance ranges on the plus side and on the minus side with respect to a potential of said source electrode of said source follower output transistor;

wherein said high impedance ranges are determined by the number of n-channel type MOS transistors, p-channel type MOS transistors, and pn-junction diodes connected in said clamp circuit.

16. A semiconductor integrated circuit having a voltage follower circuit, said voltage follower circuit comprising:

a source follower output transistor;

a differential amplifier, one input of which is connected to an output of said source follower output transistor, an output of the differential amplifier being connected to a gate electrode of said source follower output transistor; and a clamp circuit for clamping a gate potential of said source follower output transistor, said clamp circuit comprising:

a first serial connection of at least one pn-junction diode having an anode electrode connected to the gate electrode of said output transistor and a cathode electrode connected to the source and backgate electrodes of said source follower output transistor: and a second serial connection of at least one pn-junction diodes having a cathode electrode connected to the gate electrode of said source follower output transistor and an anode electrode connected to the source and backgate electrodes of said source follower output transistor.

17. A semiconductor integrated circuit as set forth in claim 16, wherein said clamp circuit has predetermined finite high impedance ranges on the plus side and on the minus side with respect to a potential of said source electrode of said source follower output transistor;

wherein said high impedance ranges are determined by the number of pn junction diodes connected in said clamp circuit.

18. A semiconductor integrated circuit having a voltage follower circuit, said voltage follower circuit comprising:

a source follower output stage having an output n-channel type MOS transistor whose drain electrode is connected to a first power supply voltage line and whose backgate electrode is connected to the source electrode thereof, and a divider circuit connected between the source electrode of said output n-channel type MOS transistor and a second power supply voltage line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

at least one n-channel type MOS transistor and at least one pn-junction diode connected in series between a first power supply voltage line and a gate electrode of said source follower output transistor; and at least one p-channel type MOS transistor and at least one pn-junction diode connected in series between a second power supply voltage line and a gate electrode of said source follower output transistor, wherein the gate electrode of a first at least one n-channel type MOS transistor, the gate electrode of a first at least one p-channel type MOS transistor, and the source electrode of said source follower output transistor are mutually connected.

19. A semiconductor integrated circuit as set forth in claim 18, wherein said clamp circuit has predetermined finite high impedance ranges on the plus side and on the minus side with respect to a potential of said source electrode of said source follower output transistor;

wherein said high impedance ranges are determined by the number of n-channel type MOS transistors, p-channel type MOS transistors, and pn-junction diodes connected in said clamp circuit.

20. A semiconductor integrated circuit having a voltage follower circuit, said voltage follower circuit comprising:

a source follower output stage having an output n-channel type MOS transistor whose drain electrode is connected to a first power supply voltage line and whose backgate electrode is connected to the source electrode thereof, and a divider circuit connected between the source electrode of said output n-channel type MOS transistor and a second power supply voltage line and comprising a series connection of at least a first resistor and a second resistor;

a differential amplifier which amplifies a difference voltage between a divided voltage from said divider circuit of said output stage and a reference voltage applied from an external source; wherein said divided voltage from said divider circuit of said output stage is being fed back to the gate electrode of said output n-channel type MOS transistor via said differential amplifier; and a clamp circuit for clamping a gate potential of said output n-channel type MOS transistor comprising:

a first serial connection of at least one pn-junction diode having an anode electrode connected to the gate electrode of said output transistor and a cathode electrode connected to the source and backgate electrodes of said output n-channel type MOS transistor; and a second serial connection of at least one pn-junction diode having a cathode electrode connected to the gate electrode of said output n-channel type MOS transistor and an anode electrode connected to the source and backgate electrodes of said output n-channel type MOS transistor.

21. A semiconductor integrated circuit as set forth in claim 20, wherein said clamp circuit has predetermined finite high impedance ranges on the plus side and on the minus side with respect to a potential of said source electrode of said source follower output transistor;

wherein said high impedance ranges are determined by the number of pn-junction diodes connected in said clamp circuit.

* * * * *